(12) United States Patent
Ki et al.

(10) Patent No.: US 10,299,390 B2
(45) Date of Patent: May 21, 2019

(54) COVER WINDOW AND DISPLAY DEVICE INCLUDING THE SAME

(71) Applicant: LG Display Co., Ltd., Seoul (KR)

(72) Inventors: Nam Ki, Seoul (KR); Jae-Hyoung Park, Gyeonggi-do (KR); Gyu-Ho Lee, Seoul (KR)

(73) Assignee: LG Display Co., Ltd., Seoul (KR)

( * ) Notice: Subject to any disclaimer, the term of this patent is extended or adjusted under 35 U.S.C. 154(b) by 135 days.

(21) Appl. No.: 15/384,794

(22) Filed: Dec. 20, 2016

(65) Prior Publication Data
US 2017/0196101 A1    Jul. 6, 2017

(30) Foreign Application Priority Data

Dec. 31, 2015  (KR) .................. 10-2015-0191641
Oct. 26, 2016  (KR) .................. 10-2016-0140217

(51) Int. Cl.
| | |
|---|---|
| H05K 5/00 | (2006.01) |
| H05K 5/03 | (2006.01) |
| H01L 51/52 | (2006.01) |
| G06F 1/16 | (2006.01) |
| H04M 1/18 | (2006.01) |
| G02F 1/1333 | (2006.01) |
| H04M 1/02 | (2006.01) |

(52) U.S. Cl.
CPC ......... *H05K 5/0017* (2013.01); *G06F 1/1637* (2013.01); *H01L 51/524* (2013.01); *H04M 1/185* (2013.01); *H05K 5/03* (2013.01); *G02F 2001/133331* (2013.01); *G02F 2202/022* (2013.01); *G02F 2202/09* (2013.01); *G02F 2202/28* (2013.01); *H01L 2251/5338* (2013.01); *H04M 1/0266* (2013.01)

(58) Field of Classification Search
None
See application file for complete search history.

(56) References Cited

U.S. PATENT DOCUMENTS

| | | | | |
|---|---|---|---|---|
| 7,714,071 B2 * | 5/2010 | Hoenig | ............... | C08L 23/0815 524/500 |
| 2014/0065326 A1 * | 3/2014 | Lee | .......................... | G06F 1/16 428/12 |
| 2014/0287213 A1 * | 9/2014 | Lee | ................... | G02F 1/133308 428/217 |

(Continued)

FOREIGN PATENT DOCUMENTS

KR    10-2012-0089077    *   9/2012   ..... H01L 2251/5338

OTHER PUBLICATIONS

Covestro Thermoplastic Polyurethanes, https://www.tpu.covestro.com/en/Technologies/Properties/Optical-Properties (Year: 2018).*

(Continued)

*Primary Examiner* — David Sample
*Assistant Examiner* — Nicole T Gugliotta
(74) *Attorney, Agent, or Firm* — Morgan, Lewis & Bockius LLP

(57) ABSTRACT

There is provided a cover window including a first region; and second regions at both sides of the first region, wherein the first region has a stiffness being different from the second regions, and the stiffness of an interface region between the first region and the second region is gradually changed.

20 Claims, 11 Drawing Sheets

(56) References Cited

U.S. PATENT DOCUMENTS

| | | | |
|---|---|---|---|
| 2015/0043174 A1* | 2/2015 | Han | G02F 1/13452 |
| | | | 361/749 |
| 2015/0207102 A1* | 7/2015 | Jeong | H04M 1/0268 |
| | | | 257/40 |
| 2015/0237182 A1* | 8/2015 | Lee | H04M 1/0266 |
| | | | 455/566 |
| 2016/0187931 A1* | 6/2016 | Myung | G06F 1/1652 |
| | | | 361/679.3 |
| 2017/0170417 A1* | 6/2017 | Myung | H01L 27/3244 |

OTHER PUBLICATIONS

Scientific Polymer Products, "Refractive Index of Polymers by Index," http://scientificpolymer.com/technical-library/refractive-index-of-polymers-by-index/ (Year: 2013).*

* cited by examiner

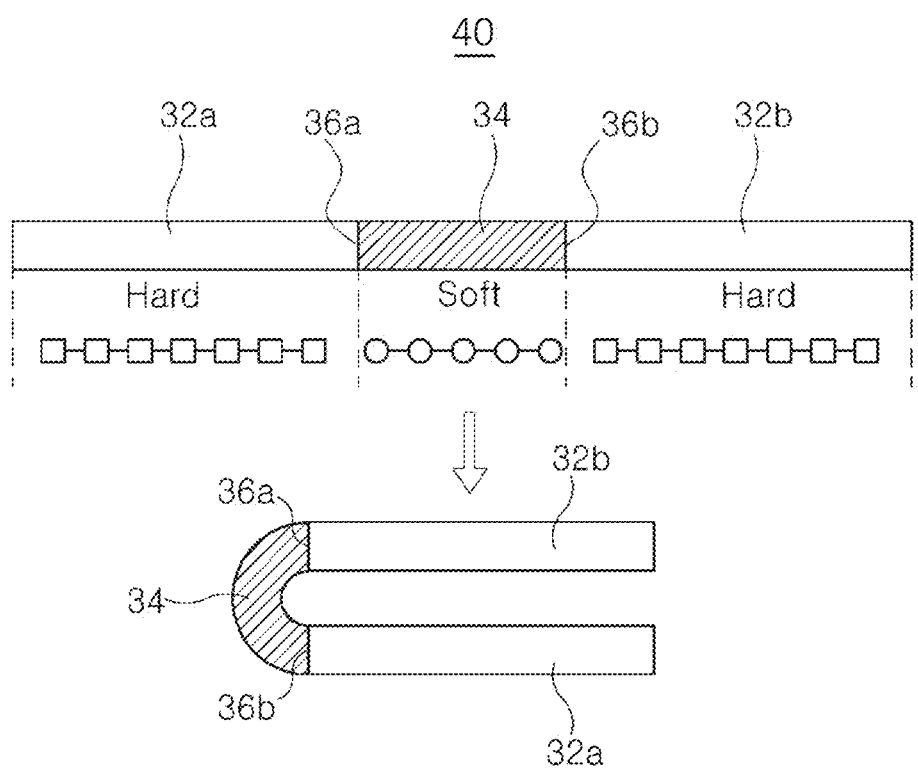

500

COVER WINDOW AND DISPLAY DEVICE INCLUDING THE SAME

CROSS-REFERENCE TO RELATED APPLICATION

The present application claims the benefit of Korean Patent Application No. 10-2015-0191641 filed in the Republic of Korea on Dec. 31, 2015 and Korean Patent Application No. 10-2016-0140217 filed on Oct. 26, 2016, all of which are hereby incorporated by reference in their entirety.

BACKGROUND

1. Field

The present disclosure relates to a display device, and more particularly, to a cover window having an excellent optical property and a display device including the same.

2. Discussion of Related Art

As display technology has been developed, a display device, such as a liquid crystal display (LCD) device and an organic light emitting display (OLED) device, is used for a computer monitor, a television, a mobile phone and a smart apparatus.

The display device may include a display panel and a cover glass. The cover glass may be formed of tempered glass or plastic such that the display panel is protected by the cover window.

Generally, the cover glass and the display panel are attached by a direct bonding method. In the direct bonding method, the cover glass and the display panel are attached using an optical clear resin (OCR) or an optical clear adhesive (OCA).

FIG. 1 is a schematic cross-sectional view of the related art display device.

As shown in FIG. 1, the display device 1 includes a display panel 10, a cover glass 30 over the display panel 10 and an adhesive layer 20 between the display panel 10 and the cover glass 30. The adhesive layer 20 may be an OCA or an OCR.

Recently, a display device being capable of a touch operation is required. In addition, a foldable display device being flexible and/or bendable is required. As a result, a cover window being formed of plastic is used instead of the cover glass 30.

FIG. 2 is a schematic view illustrating a cover window for a foldable display device.

As shown in FIG. 2, a cover window 40 includes a soft region 34 and hard regions 32a and 32b adjacent to the soft region 34. The soft region 34 is formed of a soft material such as a urethane polymer, and the hard regions 32a and 32b are formed of a hard material such as polymethylmethacrylate (PMMA) or polycarbonate (PC). Since the material of the soft region 34 and the material of the hard regions 32a and 32b have a difference in a modulus property, the cover window 40 can be folded with respect to the soft region 34.

The foldable cover window 40 may be fabricated by a double injection molding method as one of a multi-component injection molding method. The soft material is filled in a mold and injected with holding pressure. Next, the hard material is filled in the mold to be adjacent to the soft material and injected with holding pressure. As a result, the foldable cover window 40 including the soft region 34 and the hard regions 32a and 32b can be provided.

High optical property is required in the cover window 40 for the display device. However, when the cover window 40 is used for the foldable display device, interfaces 36a and 36b between the soft region 34 and each of the hard regions 32a and 32b are observed.

SUMMARY

Accordingly, the present invention is directed to a cover window and a display device including the same that substantially obviate one or more of the problems due to limitations and disadvantages of the related art.

Additional features and advantages of the invention will be set forth in the description that follows, and in part will be apparent from the description, or may be learned by practice of the invention. The objectives and other advantages of the invention will be realized and attained by the structure particularly pointed out in the written description and claims hereof as well as the appended drawings.

To achieve these and other advantages and in accordance with the purpose of the present invention, as embodied and broadly described, a cover window comprises a first region; and second regions at both sides of the first region, wherein the first region has a stiffness being different from the second regions, and the stiffness of an interface region between the first region and the second region is gradually changed.

In another aspect, a cover window comprises a first region; and second regions at both sides of the first region, wherein the first region has a stiffness being different from the second regions, and the first region, the second region and an interface region between the first region and the second region have a difference in a surface morphology.

In another aspect, a display device comprises a display panel; and a cover window at a surface of the display panel and including a first region and second regions at both sides of the first region, wherein the first region has a stiffness being different from the second regions, and the stiffness of an interface region between the first region and the second region is gradually changed.

In another aspect, a display device comprises a display panel including a front surface and first and second side surfaces; and a cover window including first and second regions respectively corresponding to the first and second side surfaces and a third region corresponding to the front surface, wherein the third region has a stiffness being greater than the first and second regions.

It is to be understood that both the foregoing general description and the following detailed description are by example and explanatory and are intended to provide further explanation of the claimed subject matter.

BRIEF DESCRIPTION OF THE DRAWINGS

The accompanying drawings, which are included to provide a further understanding of the disclosure and are incorporated in and constitute a part of this specification, illustrate embodiments and together with the description serve to explain the principles of the disclosure.

FIG. 2 is a schematic view illustrating a cover window for a foldable display device.

DETAILED DESCRIPTION

Reference will now be made in detail to embodiments, examples of which are illustrated in the accompanying drawings.

Figure 1:
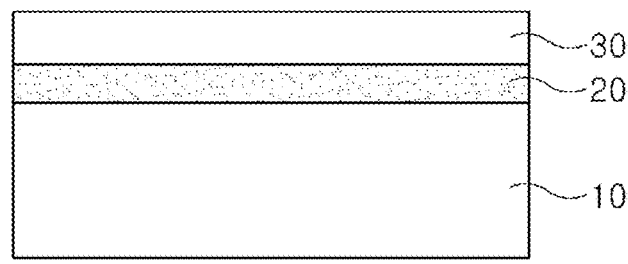
FIG. 1 is a schematic cross-sectional view of the related art display device.
Figure 3A:
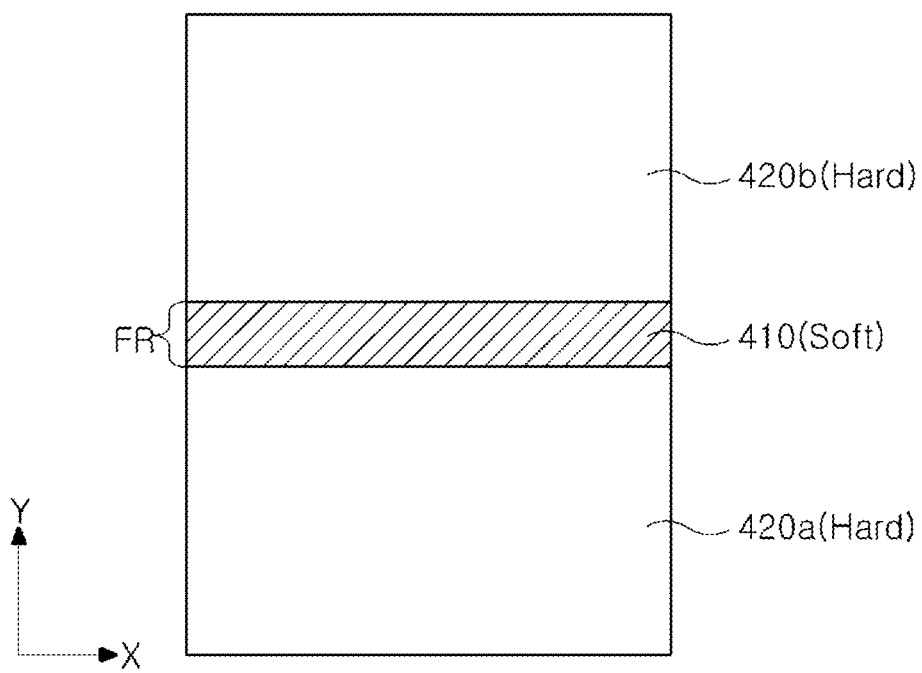
FIGS. 3A to 3C are schematic views illustrating a cover window according to a first embodiment of the present invention, respectively.
Figure 3B:
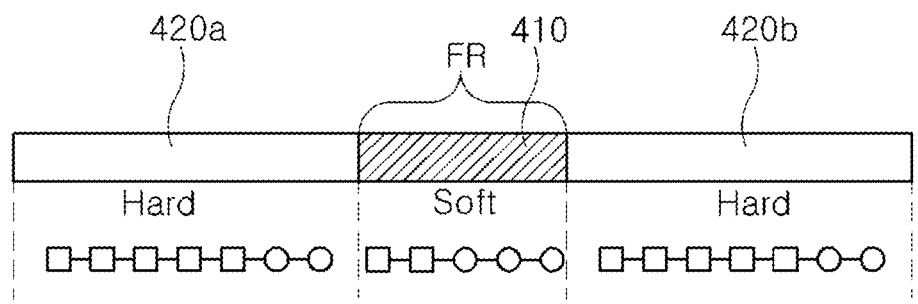
Figure 3C:
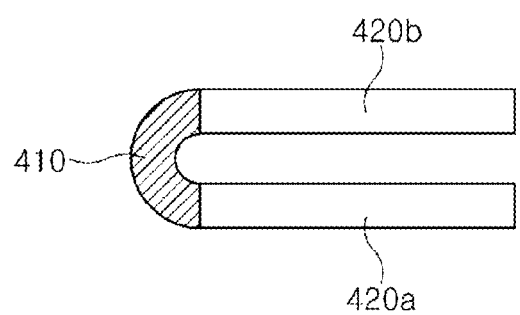
Figure 4:
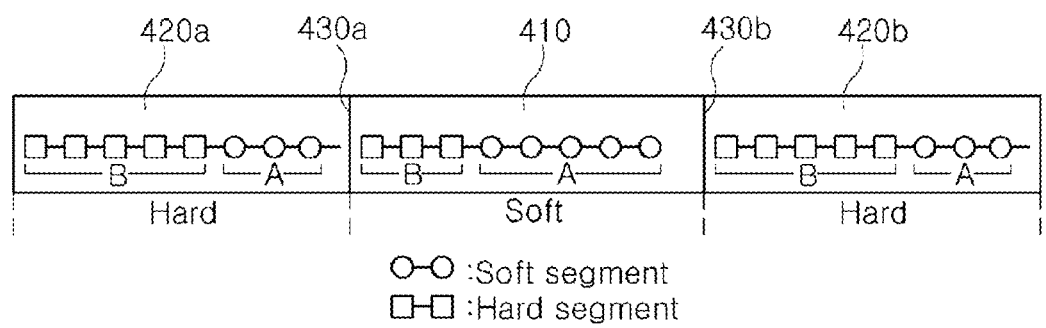
FIG. 4 is a schematic view illustrating a copolymer for the cover window according to the first embodiment of the present invention.

FIGS. 3A to 3C are schematic views illustrating a cover window according to a first embodiment of the present invention, respectively, and FIG. 4 is a schematic view illustrating a copolymer for the cover window according to the first embodiment of the present invention.

As shown in FIGS. 3A to 3C and FIG. 4, the cover window 400 according to the first embodiment of the present invention includes a first region 410 and second regions 420a and 420b being adjacent to and at both sides of the first region 410.

In the cover window 400, a folding region FR is defined. With respect to the folding region FR along an X direction, both ends along an Y direction, which is perpendicular to the X direction, are folded along a direction perpendicular to the cover window 400.

FIG. 3A shows the folding region FR extends along the X direction, i.e., a minor axis of the cover window 400. Alternatively, the folding region FR may extend along the Y direction, i.e., a major axis of the cover window 400.

The first region 410 corresponds to the folding region FR, and the second regions 420a and 420b correspond to a non-folding region at both sides of the folding region FR. Each of the first region 410 and the second regions 420a and 420b includes a block-copolymer. The block-copolymer includes a high stiffness unit and a low stiffness unit. In other words, the high stiffness unit and the low stiffness unit of the block-copolymer are same in the first region 410 and the second regions 420a and 420b.

However, a mole fraction of the low stiffness unit in the first region 410 is greater than that of the low stiffness unit in each of the second regions 420a and 420b. Namely, the block-copolymer in the first region 410 has a relatively higher mole fraction of the low stiffness unit than the block-copolymer in the second regions 420a and 420b, while the block-copolymer in the second regions 420a and 420b has a relatively higher mole fraction of the high stiffness unit than the block-copolymer in the first region 410. Accordingly, the first region 410 has a modulus value being smaller than each of the second regions 420a and 420b such that the first region 410 serves as the folding region FR.

For example, the low stiffness unit of the block-copolymer may be a unit of a polymer selected from a group including polyurethane (PU), polybutylacrylate (PBA), polystyrene, polybutadiene, polyethylene and their copolymer. In addition, the high stiffness unit of the block-copolymer may be a unit of a polymer selected from a group including polymethylmethacrylate (PMMA), polycarbonate (PC) and their copolymer. The low stiffness unit and the high stiffness unit may be arranged in a block pattern.

The block-copolymer for the first region 410 and the second regions 420a and 420b may include different units having a difference in stiffness. In the first region 410, the mole % of the low stiffness unit is greater than the mole % of the high stiffness unit. In the hard regions 420a and 420b, the mole % of the high stiffness unit is greater than the mole % of the low stiffness unit.

For example, the block-copolymer for the first and second regions 410, 420a and 420b may be represented by Formula 1.

 [Formula 1]

In the Formula 1, "A" may be a unit of a polymer selected from a group including polyurethane (PU), polybutylacrylate (PBA), polystyrene, polybutadiene, polyethylene and their copolymer, and "B" may be a unit of a polymer selected from a group including polymethylmethacrylate (PMMA), polycarbonate (PC) and their copolymer. In addition, "m" and "n" is a mole fraction of "A" and "B", respectively, and a summation of "m" and "n" is one (1). (m+n=1)

In the first region 410, "m" is greater than "n". In each of the second regions 420a and 420b, "m" is smaller than "n".

On the other hand, the block-copolymer for the first region 410 may be represented by Formula 2, and the block-copolymer for the second regions 420a and 420b may be represented by Formula 3.

 [Formula 2]

 [Formula 3]

In the Formulas 2 and 3, "A" may be a unit of a polymer selected from a group including polyurethane (PU), polybutylacrylate (PBA), polystyrene, polybutadiene, polyethylene and their copolymer, and "B" may be a unit of a polymer selected from a group including polymethylmethacrylate (PMMA), polycarbonate (PC) and their copolymer. In the Formula 2, "m1" and "n1" is a mole fraction of "A" and "B", respectively, and a summation of "m1" and "n1" is one (1). (m1+n1=1) In the Formula 3, "m2" and "n2" is a mole fraction of "A" and "B", respectively, and a summation of "m2" and "n2" is one (1). (m2+n2=1)

In this instance, "m1" is greater than "m2", and "n1" is smaller than "n2". (m1>m2, n1<n2)

For example, "m1" may be about 0.6 to 0.95, and "n1" may be about 0.05 to 0.4. In addition, "m2" may be about 0.05 to 0.4, and "n2" may be about 0.6 to 0.95.

In the cover window 400 of the present invention, the low stiffness unit and the high stiffness unit for the first region 410 and the second regions 420a and 420b have different contents such that the first region 410 and the second regions 420a and 420b have a difference in a modulus value. Namely, in the block-copolymer, when the content (i.e., the mole %) of the low stiffness unit is increased, the modulus value of the block-copolymer is decreased. On the other hand, when the content of the high stiffness unit is increased, the modulus value of the block-copolymer is increased. Interface regions 430a and 430b between the first region 410 and each of the second regions 420a and 420b may have a modulus value between the first region 410 and of the second regions 420a and 420b.

The first region 410, where the low stiffness unit in the block-copolymer is relatively high, and the second regions 420a and 420b, where the high stiffness unit in the block-copolymer is relatively high, and the interface regions 430a and 430b have a difference in a surface morphology.

The flexibility of the first region 410 is increased such that the first region 410 has an excellent impact-resistance property. The second region 420a and 420b have excellent hardness and scratch-resistance property and good stiffness. In other words, the second regions 420a and 420b have the stiffness and hardness being greater than the first region 410. For example, the stiffness of the second regions 420a and 420b is about 2.5 to 7 times greater as the first region 410. The hardness (e.g., pensile hardness) of the first region 410 is 4B to 6B grade, and the hardness of the second region 420a and 420b is more than H grade.

The stiffness and/or the hardness of the interface regions 430a and 430b may be gradually changed to be greater from a side of the first region 410 to a side of the second regions 420a and 420b.

Since the mole % of the low stiffness unit in the block-copolymer for the first region 410, which corresponds to the folding region FR, is greater than that of the low stiffness unit in the block-copolymer for the second regions 420a and 420b, the first region 410 has a modulus value being less than the second regions 420a and 420b.

Accordingly, as shown in FIG. 3C, the folding operation is provided in the folding region FR, i.e., the first region 410, and the cover window 400 has a sufficient or desired modulus value in a total.

When a polymer of the low stiffness unit and another polymer of the high stiffness unit are mixed to form the cover window (not in a block-copolymer type), it is very difficult to uniformly mix the two polymers, and a phase separation problem may be generated. As a result, a display quality of the display device including the cover window, which is formed by the two polymers, is decreased. However, in the present invention, since the cover window is formed of the block-copolymer including the low stiffness unit and the high stiffness unit, the above problems is not generated.

In the block-copolymer of the first region 410 and the second regions 420a and 420b, there is a difference in the content of the low stiffness unit A (of the Formula 1) and the high stiffness unit B (of the Formula 1). However, the block-copolymer of the first region 410 and the second regions 420a and 420b has the same component, i.e., the low stiffness unit and the high stiffness unit. Accordingly, the first region 410, the second regions 420a and 420b and the interface regions 430a and 430b have substantially the same refractive index.

Although the first region 410 and the second regions 420a and 420b have a difference in the modulus value, the light is not refracted at the interface regions 430a and 430b between the first region 410 and each of the second regions 420a and 420b because there is no difference in the refractive index between the first region 410 and the second regions 420a and 420b.

When a polymer of the low stiffness unit and another polymer of the high stiffness unit are mixed to form the cover window (not in a blocked-copolymer type), there may be a difference in the refractive index according to the ratio of the two polymers.

As mentioned above, since there is no light refraction at the interface regions 430a and 430b between the first region 410 and each of the second regions 420a and 420b, the interface regions 430a and 430b are not observed such that the display device has good appearance.

The first region 410 and the second regions 420a and 420b of the cover window are formed of the block-copolymer including the low stiffness unit and the high stiffness unit. The low stiffness unit of the block-copolymer may be a unit of a polymer selected from a group including polyurethane (PU), polybutylacrylate (PBA), polystyrene, polybutadiene, polyethylene and their copolymer. In addition, the high stiffness unit of the block-copolymer may be a unit of a polymer selected from a group including polymethylmethacrylate (PMMA), polycarbonate (PC) and their copolymer.

After a material of the low stiffness unit and a material of the high stiffness unit are injected into a space between two glasses, a glass cell casting process may be performed to form the cover window.

In more detail, the material (e.g., butylacrylate) of the low stiffness unit and the material (e.g., methylmetacrylate) of the high stiffness unit are injected into a space of two glasses in different contents (amounts). For example, in the first region 410, the material of the low stiffness unit is injected more than the material of the high stiffness unit. In the second regions 420a and 420b, the material of the high stiffness unit is injected more than the material of the low stiffness unit. The two glasses may be transferred into an oven such that a polymerization reaction of the low and high stiffness unit is generated. After completion of the polymerization reaction, the two glasses are de-molded (released) such that the plastic cover window 400 including the first region 410 of low stiffness and/or low hardness and the second regions 420a and 420b of high stiffness and/or high hardness are provided.

Figure 5A:
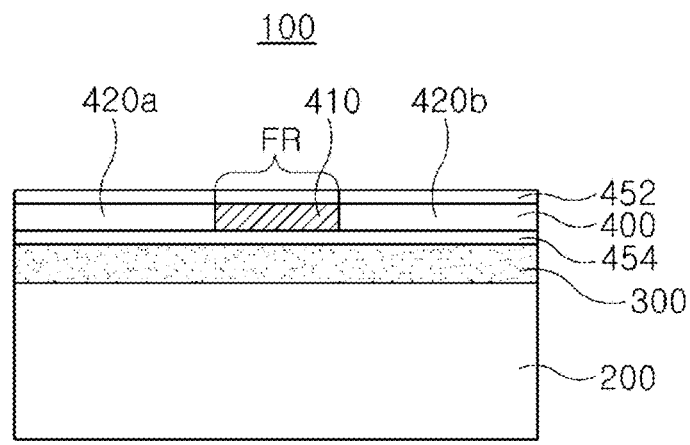
FIGS. 5A and 5B are schematic cross-section views of a display device including the cover window according to the first embodiment of the present invention, respectively.
Figure 5B:
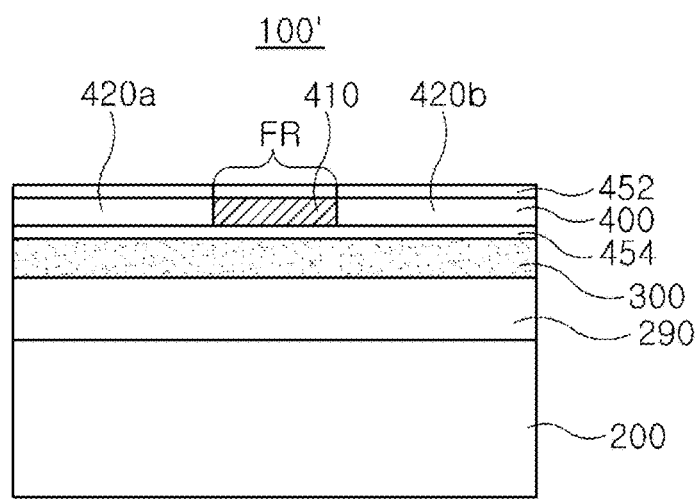

FIGS. 5A and 5B are schematic cross-section views of a display device including the cover window according to the first embodiment of the present invention, respectively.

As shown in FIG. 5A, the display device 100 as a foldable display device includes a display panel 200, a cover window 400 over a side of the display panel 200 and an adhesive layer 300 between the display panel 200 and the cover window 400. The display panel 200 may be a liquid crystal panel or an organic light emitting diode panel. However, it is not limited thereto.

The cover window includes the first region 410 and the second regions 420a and 420b at both sides of the first region 410. The first region 410 and the second regions 420a and 420b include the same block-copolymer with a different content of the low and high stiffness units. Upper and lower hard-coating layers 452 and 454 for reinforcing or protecting the cover window 400 may be positioned at an upper side and a lower side of the cover window 400.

Generally, since the cover window 400 may be disposed at an uppermost position of the display device 100, an abrasion (or wear) resistance property and/or an impact resistance property are necessary in the cover window 400 to prevent damages, such as scratches, caused by a touch. Accordingly, the first hard layer 452 and the second hard layer 454 of a hard type material to provide high hardness are formed on the upper side and the lower side of the cover window 400, respectively. For example, each of the first and second hard layers 452 and 454 may formed by using one of an urethane acrylate resin, a metacrylate resin and a silsesquioxane compound. Each of the first and second hard layers 452 and 454 may be coated on the cover window using one of roll coating method, a spin coating method, a dip coating method, a flow coating method and a spray coating method.

The adhesive layer 300 between the display panel 200 and the cover window 400 may be an optical clear resin (OCA). For example, the adhesive layer 300 may be formed of one of an acrylate resin, a (met)acrylate resin, a siloxane resin, a rubber resin and an urethane resin. The cover window 400 is attached or adhered to the display panel 200 by the cover window 300.

Referring to FIG. 5B, a display device 100' as the foldable display device includes the display panel 200, the cover window 400, a touch panel 290, which may be referred to as a touch-screen panel, between the display panel 200 and the cover window 400 and the adhesive layer 300 between the touch panel 290 and the cover window 400. In FIG. 5B, the touch panel 290 is disposed on the display panel 200. Namely, an add-on type touch panel 290 is shown in FIG. 5B. Alternatively, the touch panel 290 may be disposed in the display panel 200 such that an embedded type touch display device, such as an on-cell type or an in-cell type, may be provided.

Figure 6:
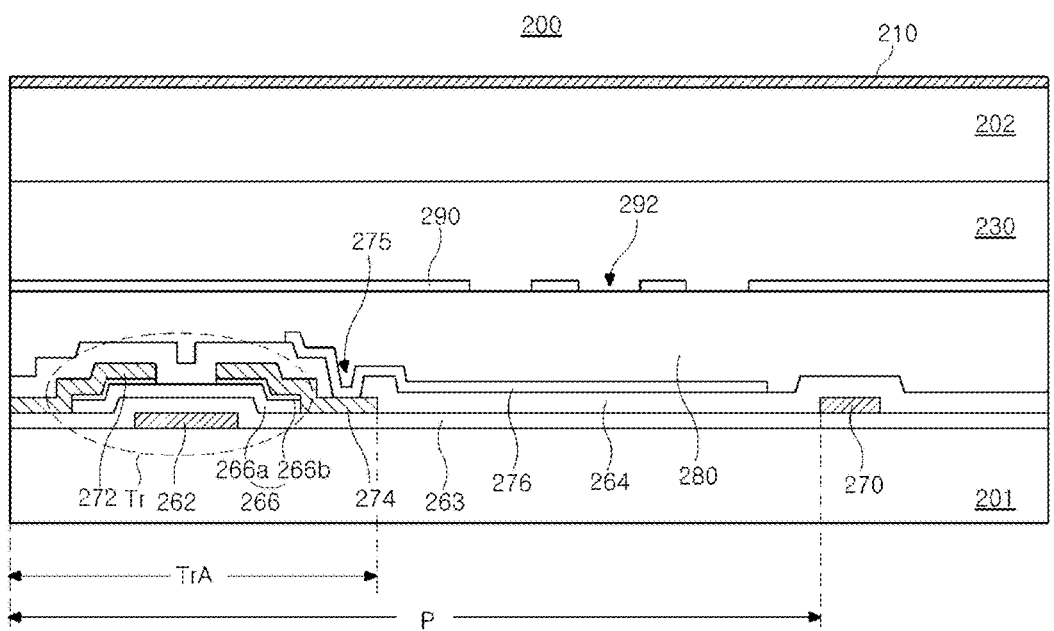
FIG. 6 is a schematic cross-sectional view of a liquid crystal panel.

Referring to FIG. 6, which is a schematic cross-sectional view of a liquid crystal panel, the liquid crystal panel 200 as the display panel 200 (of FIG. 5A or FIG. 5B) includes first and second substrates 201 and 202 facing each other and a liquid crystal layer 230 therebetween.

Each of the first and second substrates 201 and 202 is flexible. For example, each of the first and second substrates 201 and 202 may be a polyimide plastic substrate. On the first substrate 201, at least one electrode and at least one signal line are formed.

On the first substrate 201, a plurality of gate lines (not shown) extend along a first direction, and a plurality of data lines 270 extend along a second direction. The gate lines and the data lines 270 cross each other to define a plurality of pixel regions P. In a non-display region of the first substrate 201, a gate pad connected to an end of the gate line and a data pad connected to an end of the data line 270 are formed.

A thin film transistor (TFT) Tr including a gate electrode 262, a gate insulating layer 263, a semiconductor layer 266, a source electrode 272 and a drain electrode 274 is formed in each pixel region P.

The gate electrode 262 is connected to the gate line and formed on the first substrate 201. The gate insulating layer 263, which is formed of an inorganic insulating material, such as silicon oxide (SiOx) or silicon nitride (SiNx), is formed to cover the gate line and the gate electrode 262.

The semiconductor layer 266 is formed on the gate insulating layer 263 and corresponds to the gate electrode 262. The semiconductor layer 266 includes an active layer 266a of intrinsic amorphous silicon and an ohmic contact layer of impurity-doped amorphous silicon.

The source electrode 272 and the drain electrode 274 are formed on the semiconductor layer 266 and spaced apart from each other. The source electrode 272 is connected to the data line 270 on the gate insulating layer 263. As a result, the TFT Tr is electrically connected to the gate line and the data line 270. The TFT Tr is positioned in a switching region TrA.

Although not shown, a common line being parallel to one of the gate line and the data line 270 may be formed on or over the first substrate 201.

A first passivation layer 264, which covers the TFT Tr and the data line 270 and includes a drain contact hole 275, is formed over the first substrate 201. The drain contact hole 275 exposes the drain electrode 274 of the TFT Tr. The first passivation layer 264 may be an inorganic insulating layer of silicon oxide or silicon nitride or an organic insulating layer of photo-acryl. The first passivation layer 264 protects the active layer 266a and/or the ohmic contact layer 266b in the step of forming a pixel electrode 276.

The pixel electrode 276 is formed on the first passivation layer 264. The pixel electrode 276 is connected to the drain electrode 274 of the TFT Tr and has a plate shape in each pixel region P. The pixel electrode 276 may be formed of a transparent conductive material such as indium-tin-oxide (ITO) or indium-zinc-oxide (IZO).

Although not shown, a gate pad electrode and a data pad electrode, which are formed of the same material as the pixel electrode 276, may be formed on the first passivation layer 264 in the non-display region. The gate pad electrode is electrically connected to the gate pad through the gate pad contact hole, and the data pad electrode is electrically connected to the data pad through the data pad contact hole.

A second passivation layer 280 is formed to cover the pixel electrode 276. The second passivation layer 280 may be an inorganic insulating layer of silicon oxide or silicon nitride or an organic insulating layer of photo-acryl.

A common electrode 290 is formed on the second passivation layer 280. The common electrode 290 has a hole (or opening) 292 in correspondence to the pixel electrode 276. The common electrode 290 may be formed of a transparent conductive material such as ITO or IZO. The common electrode 290 of a plate shape may have a single integral shape in a display region including the plurality of pixel regions P. The pixel electrode 276 and the common electrode 290 generate a fringe field to drive liquid crystal molecules in the liquid crystal layer 230. As a result, in the liquid crystal panel 200, a transmittance efficiency is improved, and a high quality image is displayed.

Although not shown, under the second substrate 202, which may be referred to as a color filter substrate, a black matrix as a light-shielding element having a lattice shape in correspondence to the pixel region P and a color filter layer corresponding to the pixel region P are formed. The color filter layer may include red, green and blue color filters. In addition, an overcoat layer as a planarization layer may be further formed on the color filter layer. The overcoat layer may be formed of polyimide, polyacrylate or polyurethane.

A first polarization plate 210 is attached on an outer side of the second substrate 202. Although not shown, a second polarization plate is attached on an outer side of the first substrate 201. The first polarization plate 210 and the second polarization plate may have polarization axes being perpendicular to each other.

A backlight unit (not shown) including a light source is disposed under the liquid crystal panel 200 to provide light toward the liquid crystal panel 200.

The adhesive layer 300 (of FIG. 5A) is positioned between the first polarization plate 210 at the outer side of the second substrate 201 and the cover window 400 (of FIG. 5A) such that the liquid crystal panel 200 and the cover window 400 is attached.

Figure 7:
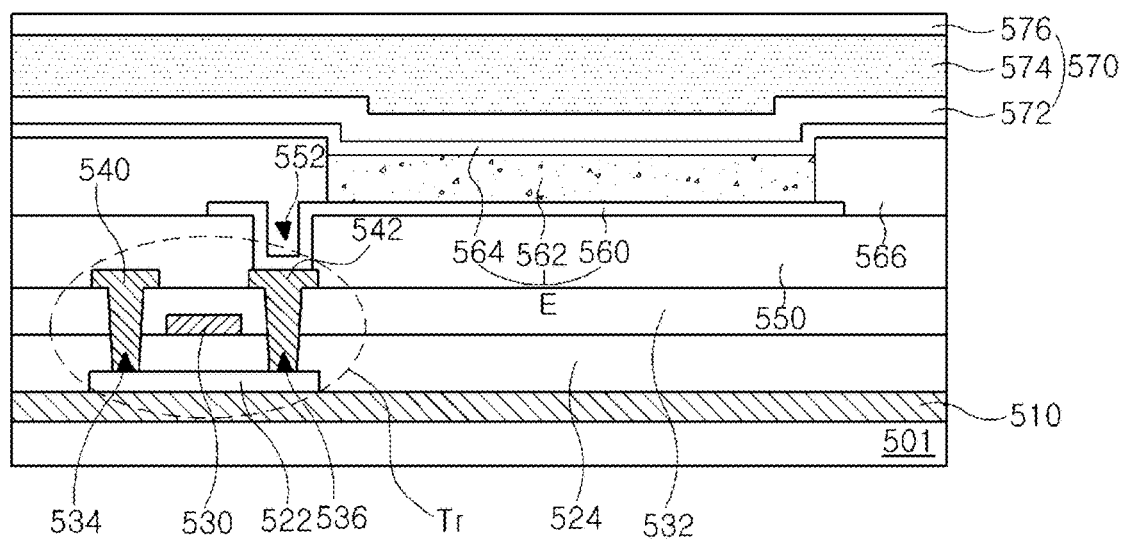
FIG. 7 is a schematic cross-sectional view of an organic light emitting diode panel.

Referring to FIG. 7, which is a schematic cross-sectional view of an organic light emitting diode panel, the organic light emitting diode panel 500 as the display panel 200 (of FIG. 5A or FIG. 5B) includes a flexible substrate 501 and an emitting diode E over the flexible substrate 501.

The flexible substrate 501 may be a polyimide plastic substrate. The flexible substrate 501 is not adequate to the fabrication process for the elements of the organic light emitting diode panel 500. Accordingly, with the flexible substrate 501 attached onto the carrier substrate, e.g., a glass substrate, the elements of the organic light emitting diode panel 500, e.g., the TFT Tr or the emitting diode E, may be formed on or over the flexible substrate 501. Then, the flexible substrate 501 is separated or released from the carrier substrate such that the organic light emitting diode panel 500 may be provided.

A buffer layer 510 is formed on the flexible substrate 501, and the TFT Tr is formed on the buffer layer 510. The buffer layer 510 may be omitted.

A semiconductor layer 522 is formed on the buffer layer 510. The semiconductor layer 522 may include an oxide semiconductor material or polycrystalline silicon.

When the semiconductor layer 522 includes the oxide semiconductor material, a light-shielding pattern (not shown) may be formed under the semiconductor layer 522. The light to the semiconductor layer 522 is shielded or blocked by the light-shielding pattern such that thermal degradation of the semiconductor layer 522 can be prevented. On the other hand, when the semiconductor layer 522 includes polycrystalline silicon, impurities may be doped into both sides of the semiconductor layer 522.

A gate insulating layer 524 is formed on the semiconductor layer 522. The gate insulating layer 524 may be formed of an inorganic insulating material such as silicon oxide or silicon nitride.

A gate electrode 530, which is formed of a conductive material, e.g., metal, is formed on the gate insulating layer 524 to correspond to a center of the semiconductor layer 522.

In FIG. 7, the gate insulating layer 524 is formed on the entire surface of the flexible substrate 501. Alternatively, the gate insulating layer 524 may be patterned to have the same shape as the gate electrode 530.

An interlayer insulating layer 532, which is formed of an insulating material, is formed on an entire surface of the flexible substrate 501 including the gate electrode 530. The interlayer insulating layer 532 may be formed of an inorganic insulating material, e.g., silicon oxide or silicon nitride, or an organic insulating material, e.g., benzocyclobutene or photo-acryl.

The interlayer insulating layer 532 includes first and second contact holes 534 and 536 exposing both sides of the semiconductor layer 522. The first and second contact holes 534 and 536 are positioned at both sides of the gate electrode 530 to be spaced apart from the gate electrode 530.

In FIG. 7, the first and second contact holes 534 and 536 extend into the gate insulating layer 524. Alternatively, when the gate insulating layer 524 is patterned to have the same shape as the gate electrode 530, there may be no first and second contact holes 534 and 536 in the gate insulating layer 524.

A source electrode 540 and a drain electrode 542, which are formed of a conductive material, e.g., metal, are formed on the interlayer insulating layer 532. The source electrode 540 and the drain electrode 542 are spaced apart from each other with respect to the gate electrode 530 and respectively contact both sides of the semiconductor layer 522 through the first and second contact holes 534 and 536.

The semiconductor layer 522, the gate electrode 530, the source electrode 540 and the drain electrode 542 constitute the TFT Tr, and the TFT Tr serves as a driving element.

In FIG. 7, the gate electrode 530, the source electrode 540 and the drain electrode 542 are positioned over the semiconductor layer 522. Namely, the TFT Tr has a coplanar structure.

Alternatively, in the TFT Tr, the gate electrode may be positioned under the semiconductor layer, and the source and drain electrodes may be positioned over the semiconductor layer such that the TFT Tr may have an inverted staggered structure. In this instance, the semiconductor layer may include amorphous silicon.

Although not shown, a gate line and a data line are disposed on or over the substrate 340 and cross each other to define a pixel region. In addition, a switching element, which is electrically connected to the gate line and the data line, may be disposed on the flexible substrate 501. The switching element is electrically connected to the TFT Tr as the driving element.

In addition, a power line, which is parallel to and spaced apart from the gate line or the data line, may be formed on or over the flexible substrate 501. Moreover, a storage capacitor for maintaining a voltage of the gate electrode 530 of the TFT Tr during one frame, may be further formed on the flexible substrate 501.

A passivation layer 550, which includes a drain contact hole 552 exposing the drain electrode 542 of the TFT Tr, is formed to cover the TFT Tr.

A first electrode 560, which is connected to the drain electrode 542 of the TFT Tr through the drain contact hole 552, is separately formed on the passivation layer 550 in each pixel region P. The first electrode 560 may be an anode and may be formed of a conductive material having a relatively high work function. For example, the first electrode 560 may be formed of a transparent conductive material such as indium-tin-oxide (ITO) or indium-zinc-oxide (IZO).

A bank layer 566, which covers edges of the first electrode 560, is formed on the passivation layer 550. A center of the first electrode 560 in the pixel region is exposed through an opening of the bank layer 566.

An organic emitting layer 562 is formed on the first electrode 560. The organic emitting layer 562 may have a single-layered structure of an emitting material layer formed of an emitting material. Alternatively, to improve emitting efficiency, the organic emitting layer 562 may have a multi-layered structure including a hole injection layer, a hole transporting layer, the emitting material layer, an electron transporting layer and an electron injection layer sequentially stacked on the first electrode 560.

A second electrode 564 is formed over the flexible substrate 501 including the organic emitting layer 562. The second electrode 564 is positioned at an entire surface of the display area. The second electrode 564 may be a cathode and may be formed of a conductive material having a relatively low work function. For example, the second electrode 564 may be formed of aluminum (Al), magnesium (Mg) or Al—Mg alloy.

The first electrode 560, the organic emitting layer 562 and the second electrode 564 constitute the emitting diode E.

An encapsulation film 570 is formed on the emitting diode E to prevent penetration of moisture into the emitting diode E.

The encapsulation film 570 may have has a triple-layered structure of a first inorganic layer 572, an organic layer 574 and a second inorganic layer 576. However, it is not limited thereto.

A polarization plate (not shown) may be disposed on the encapsulation film 570 to reduce an ambient light reflection. The polarization plate may be a circular polarization film.

Referring to FIG. 5A, the cover window 400 is disposed over the display panel 200 and is attached onto the display panel 200 by the adhesive layer 300. The cover window 400 includes the first region 410 and the second regions 420a and 420b at both sides of the first region 410.

In the cover window 400, a folding region FR is defined. With respect to the folding region FR along an X direction, both ends along an Y direction, which is perpendicular to the X direction, are folded along a direction perpendicular to the cover window 400. The first region 410 corresponds to the folding region FR, and the second regions 420a and 420b correspond to a non-folding region at both sides of the folding region FR.

Each of the first region 410 and the second regions 420a and 420b includes a block-copolymer. The block-copolymer includes a high stiffness unit and a low stiffness unit. For example, the block-copolymer may be represented by the above Formulas 1 to 3.

In the first region 410, the low stiffness unit has a relatively high mole fraction. In the second regions 420a and 420b, the high stiffness unit has a relatively high mole fraction. The first region 410 has a modulus value being smaller than each of the second regions 420a and 420b such that the first region 410 serves as the folding region FR. Accordingly, the damages and a displaying image decrease by the folding operation are prevented in the foldable display device 100 (or 100') including the cover window 400.

Although the first region 410 and the second regions 420a and 420b have a difference in the modulus value, the light is not refracted at the interface regions 430a and 430b between the first region 410 and each of the second regions 420a and 420b because there is no difference in the refractive index between the first region 410 and the second regions 420a and 420b. Accordingly, the interface regions 430a and 430b are not observed such that the display device 100 (or 100') has good appearance.

Figure 8A:
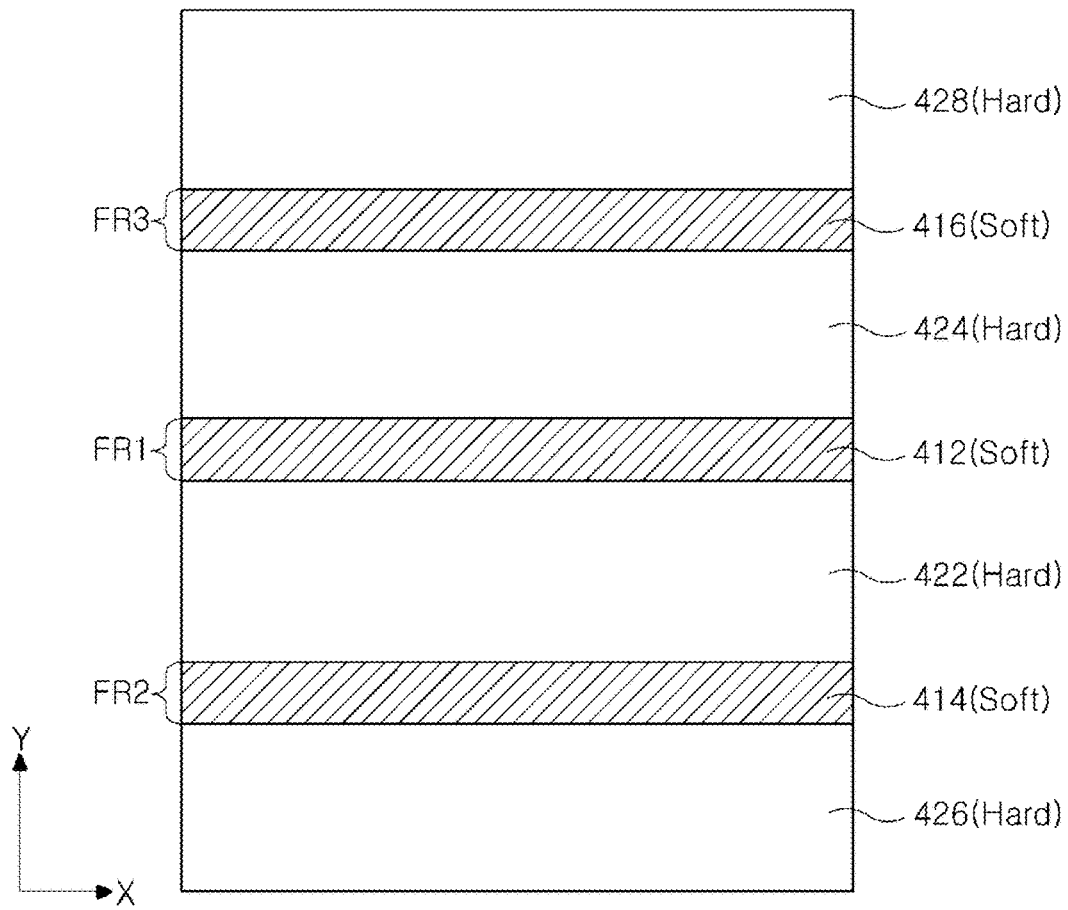
FIGS. 8A and 8B are a schematic plane view and a schematic cross-sectional view of a cover window according to a second embodiment of the present invention, respectively.
Figure 8B:
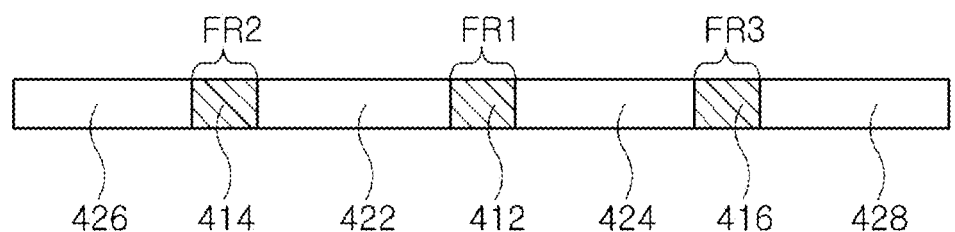

FIGS. 8A and 8B are a schematic plane view and a schematic cross-sectional view of a cover window according to a second embodiment of the present invention, respectively.

As shown in FIGS. 8A and 8B, in the cover window 400' according to the second embodiment of the present invention, first to third folding regions FR1, FR2 and FR3 are defined.

With respect to the first to third folding regions FR1 to FR3 along an X direction, both ends along an Y direction, which is perpendicular to the X direction, are folded along a direction perpendicular to the cover window 400'.

FIG. 8A shows the first to third folding regions FR1 to FR3 extend along the X direction, i.e., a minor axis of the cover window 400'. Alternatively, the first to third folding regions FR1 to FR3 may extend along the Y direction, i.e., a major axis of the cover window 400'.

The cover window 400' includes a first region 412, second regions 422 and 424 at both sides of the first region 412, third regions 426 and 428 at outer sides of the second regions 422 and 424 and fourth regions 414 and 416 between each of the second regions 422 and 424 and each of the third regions 426 and 428. The first region 412 and the fourth regions 414 and 416 have a relatively high mole fraction of the low stiffness unit in the block-copolymer, and the second regions 422 and 424 and the third regions 426 and 428 have a relatively high mole fraction of the high stiffness unit in the block-copolymer. The first and fourth regions 412, 414 and 416 and the second and third regions 422, 424, 426 and 428 are alternatively arranged.

The first region 412 and the fourth regions 414 and 416 correspond to the first to third folding regions FR1 to FR3, and the second regions 422 and 424 and the third regions 426 and 428 correspond to non-folding regions between the first region 412 and each of the fourth regions 414 and 416 and at outer sides of the fourth regions 414 and 416.

The first to third regions 412, 422, 424, 426, 429, 414 and 416 include the block-copolymer. The block-copolymer includes a high stiffness unit and a low stiffness unit. In other words, the high stiffness unit and the low stiffness unit of the block-copolymer are same in the first to third regions 412, 422, 424, 426, 429, 414 and 416.

A mole fraction of the low stiffness unit in the first region 412 and the fourth regions 414 and 416 is greater than that of the low stiffness unit in each of the second regions 422 and 424 and the third regions 426 and 428. Namely, the block-copolymer in the first region 412 and the fourth regions 414 and 416 has a relatively higher mole fraction of the low stiffness unit than the block-copolymer in the second regions 422 and 424 and the third regions 426 and 428, while the block-copolymer in the second regions 422 and 424 and the third regions 426 and 428 has a relatively higher mole fraction of the high stiffness unit than the block-copolymer in the first region 412 and the fourth regions 414 and 416. Accordingly, each of the first region 412 and the fourth regions 414 and 416 has a modulus value being smaller than each of the second regions 422 and 424 and the third regions 426 and 428 such that the first region 412 and the fourth regions 414 and 416 serves as the first to third folding regions FR1 to FR3.

The third regions 426 and 428 may have higher stiffness or higher hardness than the fourth regions 414 and 416. The stiffness or the hardness of the third regions 426 and 428 may be equal to or greater than the stiffness or the hardness of the second regions 422 and 424. In addition, the stiffness or the hardness of the fourth regions 414 and 416 may be equal to or greater than the stiffness or the hardness of the first region 412.

For example, the low stiffness unit of the block-copolymer may be a unit of a polymer selected from a group including polyurethane (PU), polybutylacrylate (PBA), polystyrene, polybutadiene, polyethylene and their copolymer. In addition, the high stiffness unit of the block-copolymer may be a unit of a polymer selected from a group including polymethylmethacrylate (PMMA), polycarbonate (PC) and their copolymer. The low stiffness unit and the high stiffness unit may be arranged in a block pattern.

For example, the block-copolymer for the first to third regions 412, 422, 424, 426, 429, 414 and 416 may be represented by Formula 4.

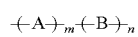 [Formula 4]

In the Formula 4, "A" may be a unit of a polymer selected from a group including polyurethane (PU), polybutylacrylate (PBA), polystyrene, polybutadiene, polyethylene and their copolymer, and "B" may be a unit of a polymer selected from a group including polymethylmethacrylate (PMMA), polycarbonate (PC) and their copolymer. In addition, "m" and "n" is a mole fraction of "A" and "B", respectively, and a summation of "m" and "n" is one (1). (m+n=1)

In the first region 412 and the fourth regions 414 and 416, "m" is greater than "n". In second regions 422 and 424 and the third regions 426 and 428, "m" is smaller than "n".

On the other hand, the block-copolymer for the first region 412 and the fourth regions 414 and 416 may be represented by Formula 5, and the block-copolymer for the second regions 422 and 424 and the third regions 426 and 428 may be represented by Formula 6.

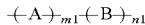 [Formula 5]

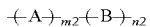 [Formula 6]

In the Formulas 5 and 6, "A" may be a unit of a polymer selected from a group including polyurethane (PU), polybutylacrylate (PBA), polystyrene, polybutadiene, polyethylene and their copolymer, and "B" may be a unit of a polymer selected from a group including polymethylmethacrylate (PMMA), polycarbonate (PC) and their copolymer. In the Formula 5, "m1" and "n1" is a mole fraction of "A" and "B", respectively, and a summation of "m1" and "n1" is one (1). (m1+n1=1) In the Formula 6, "m2" and "n2" is a mole fraction of "A" and "B", respectively, and a summation of "m2" and "n2" is one (1). (m2+n2=1)

In this instance, "m1" is greater than "m2", and "n1" is smaller than "n2". (m1>m2, n1<m2)

For example, "m1" may be about 0.6 to 0.95, and "n1" may be about 0.05 to 0.4. In addition, "m2" may be about 0.05 to 0.4, and "n2" may be about 0.6 to 0.95.

In each of the first region 412 and the fourth regions 414 and 416, a mole fraction of the low stiffness unit is relatively high. In each of the second regions 422 and 424 and the third regions 426 and 428, a mole fraction of the high stiffness unit is relatively high. Accordingly, the first region 412 and the fourth regions 414 and 416 have a modulus value being smaller than the second regions 422 and 424 and the third regions 426 and 428.

In the cover window 400' of the present invention, the low stiffness unit and the high stiffness unit for the first and fourth region 412, 414 and 416 and the second and third regions 422, 424, 426 and 428 have different contents such that the modulus value of the first and fourth region 412, 414 and 416 and the second and third regions 422, 424, 426 and 428 is controlled. Namely, in the block-copolymer, when the content (i.e., the mole %) of the low stiffness unit is increased, the modulus value of the block-copolymer is decreased. On the other hand, when the content of the high stiffness unit is increased, the modulus value of the block-copolymer is increased. The flexibility of the first and fourth region 412, 414 and 416 are increased such that the first and fourth region 412, 414 and 416 have an excellent impact-resistance property. The second and third regions 422, 424, 426 and 428 have excellent hardness and scratch-resistance property and good stiffness.

In the first and fourth regions 412, 414 and 416, a mole fraction of the low stiffness unit and the high stiffness unit may be same or different. In other words, the stiffness or the hardness of the fourth regions 414 and 416 may be greater than or equal to the first region 412. For example, since a folding stress is concentrated in the first region 412 at a center of the cover window 400', the mole fraction of the low stiffness unit in the first region 412 may be greater than the mole fraction of the low stiffness unit in the fourth regions 414 and 416. Namely, the modulus value of the fourth region 414 and 416 may be greater than the first region 412 and smaller than the second and third regions 422 to 428.

The second regions 422 and 424 and the third regions 426 and 428 may have a modulus value being same or different. For example, a ratio of the low stiffness unit of the block-copolymer in the second regions 422 and 424 may be greater than a ratio of the low stiffness unit of the block-copolymer in the third regions 426 and 428. Namely, the modulus value of the third regions 426 and 428 may be greater than that of the second regions 422 and 424. In other words, the stiffness and/or the hardness of the third regions 426 and 428 may be greater than or equal to stiffness and/or the hardness of the second regions 422 and 424.

As mentioned above, since a mole fraction of the low stiffness unit of the block-copolymer in the first and fourth regions 412, 414 and 416, which correspond to the first to third folding regions FR1, FR2 and FR3, is greater than a mole fraction of the low stiffness unit of the block-copolymer in the second and third regions 422 to 428, the first and fourth regions 412, 414 and 416 have the modulus value being smaller than the second and third regions 422 to 428.

Since the cover window 400' has a desired modulus value in a total and the first and fourth regions 412, 414 and 416, which correspond to the first to third folding regions FR1, FR2 and FR3, have a relatively low modulus value, the cover window 400' can be folded with respect to the first to third folding regions FR1, FR2 and FR3, i.e., the first and fourth regions 412, 414 and 416. In addition, in the present invention, since the cover window 400' is formed of the block-copolymer including the low stiffness unit and the high stiffness unit, the non-uniformly mixing problem and the phase separation problem is prevented.

The block-copolymer of the first and fourth regions 412, 414 and 416 and the second and third regions 422, 424, 426 and 428 has the same component, i.e., the low stiffness unit and the high stiffness unit. Although there is a difference in the content of the low stiffness unit and the high stiffness unit, the first to fourth regions 412, 422, 424, 426 and 428, 414 and 416 include the block-copolymer including the same units (components). Accordingly first to fourth regions 412, 422, 424, 426 and 428, 414 and 416 have substantially the same refractive index.

Since there is no light refraction at the interface regions between the first and fourth regions 412, 414 and 416 and the second and third regions 422, 424, 426 and 428, the interface regions are not observed. In addition, since the image is not distorted, the display device has good appearance.

The cover window 400' according to the second embodiment of the present invention is used for the foldable display device. Namely, as explained with FIGS. 5A, 5B, 6 and 7, the cover window 400' is disposed over a surface of the display panel 200, e.g., the liquid crystal panel 200 or the organic light emitting diode panel 500, such that the foldable display device 100 or 100' is provided.

The Cover Window with a Difference in a Ratio of the High Stiffness Unit (PMMA) and the Low Stiffness Unit (PBA)

The unit of the PMMA (refractive index=1.49) and the unit of the PBA (refractive index=1.46) with a different ratio are injected into a space between two glasses, and the mixture is polymerized to form the cover window.

Figure 9:
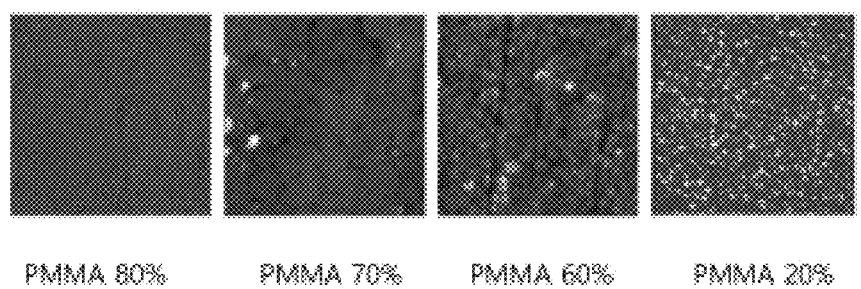
FIG. 9 is a picture showing a surface morphology of a copolymer for the cover window according to the present invention.

As shown in FIG. 9, when the unit of the PMMA has a mole fraction of 80%, the Lamellar phase separation is observed in the block-copolymer. The Lamellar phase separation is a property shown in a high stiffness (or hard) polymer. On the other hand, when the unit of the PMMA has a mole fraction of 20%, the Sphere phase separation is observed in the block-copolymer. The Sphere phase separation is a property shown in a low stiffness (or soft) polymer. Namely, with contents of the low stiffness unit and the high stiffness unit in the block-copolymer, the block-copolymer has a difference in the modulus value.

Figure 10:
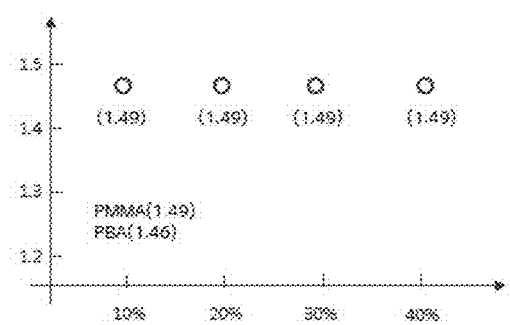
FIG. 10 is a graph showing a refractive index of a copolymer for the cover window according to the present invention.

In addition, the refractive index of the block-copolymer is measured. The refractive index in a hard region (HR), where the high stiffness unit, i.e., the unit of the PMMA, has a relatively high mole fraction, a soft region (SR), where the low stiffness unit, i.e., the unit of the PBA, has a relatively high mole fraction, and an interface region (IR) between the hard and soft regions is measured. The results are shown in FIG. 10 and listed in Table 1. (In FIG. 10, the X axis (horizontal axis) is a PBA ratio, and the Y axis (vertical axis) is a refractive index)

TABLE 1

| | PBA ratio (%) | | | | | |
|---|---|---|---|---|---|---|
| | 0 | 10 | 20 | 30 | 40 | 50 |
| HR | 1.490 | 1.490 | 1.490 | | | |
| IR | 1.490 | 1.490 | 1.490 | 1.490 | 1.490 | 1.486 |
| SR | | | | 1.490 | 1.489 | 1.496 |

As shown in FIG. 10 and Table 1, although there is a modulus difference in the hard region, the soft region and interface region, the hard region, the soft region and interface region have substantially the same refractive index.

The Cover Window with a Difference in a Ratio of the High Stiffness Unit (PMMA) and the Low Stiffness Unit (PU)

The unit of the PU (refractive index=1.512) is used instead of the unit of the PBA.

The refractive index in the hard region (HR), the soft region (SR) and the interface region (IR) is measured. The results are listed in Table 2.

TABLE 2

| | PU ratio (%) | | | | |
|---|---|---|---|---|---|
| | 0 | 10 | 20 | 30 | 40 |
| HR | 1.490 | 1.490 | 1.490 | | |
| IR | 1.490 | 1.490 | 1.490 | 1.490 | 1.494 |
| SR | | | | 1.491 | 1.495 |

As shown in Table 2, although there is a modulus difference in the hard region, the soft region and interface region, the hard region, the soft region and interface region have substantially the same refractive index.

The Cover Window with a Difference in a Ratio of the High Stiffness Unit (PMMA) and the Low Stiffness Unit (PU)

The unit of the polystyrene-polybutadiene (PS-PB) is used instead of the unit of the PBA.

The refractive index in the hard region (HR), the soft region (SR) and the interface region (IR) is measured. The results are listed in Table 3.

TABLE 3

| | PS-PB ratio (%) | | | | |
|---|---|---|---|---|---|
| | 0 | 10 | 20 | 30 | 40 |
| HR | 1.490 | 1.490 | 1.490 | | |
| IR | 1.490 | 1.490 | 1.490 | 1.490 | 1.490 |
| SR | | | | 1.491 | 1.492 |

As shown in Table 2, although there is a modulus difference in the hard region, the soft region and interface region, the hard region, the soft region and interface region have substantially the same refractive index.

Figure 11:
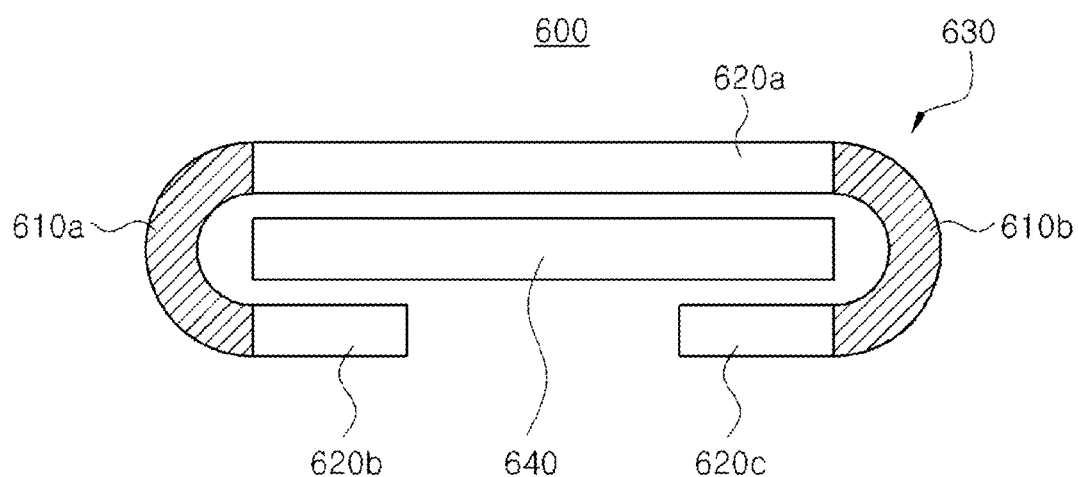
FIG. 11 is a schematic cross-section view of a display device including a cover window according to a third embodiment of the present invention.

FIG. 11 is a schematic cross-section view of a display device including a cover window according to a third embodiment of the present invention.

As shown in FIG. 11, the display device 600 includes a display panel 640 and a cover window 630 covering a front surface and a side surface of the display panel 640.

The display panel 640 may be a liquid crystal panel and an organic light emitting diode panel. However, it is not limited thereto.

The cover window 630 includes first and second regions 610a and 610b covering the side surface of the display panel 640 and a third region 620a covering the front surface of the display panel 640. In addition, the cover window 630 may further include fourth and fifth regions 620b and 620c covering first and second portions of a rear surface of the display panel 640, respectively.

For example, when the display panel 640 as the liquid crystal panel includes a backlight unit disposed under the rear surface of the liquid crystal panel, the first and second regions 610a and 610b cover the side surface of the display panel 640 and the backlight unit, and the fourth and fifth regions 620b and 620c cover the rear surface of the backlight unit.

Although not shown, the cover window 630 may be attached to the display panel 640 using an adhesive layer.

Each of the first and second regions 610a and 610b has substantially the same plane area as the side surface of the display panel 640, and the third region 620a has substantially the same plane area as the front surface, i.e., an image display surface, of the display panel 640.

In FIG. 3A, a total area of the first region 410 and the second regions 420a and 420b is substantially same as the front surface of the display panel.

However, in the cover window 630 shown in FIG. 11, the third region 620a corresponds to the front surface of the display panel 640, and the first and second regions 610a and 610b are positioned at sides of the third region 620a.

Figure 12:
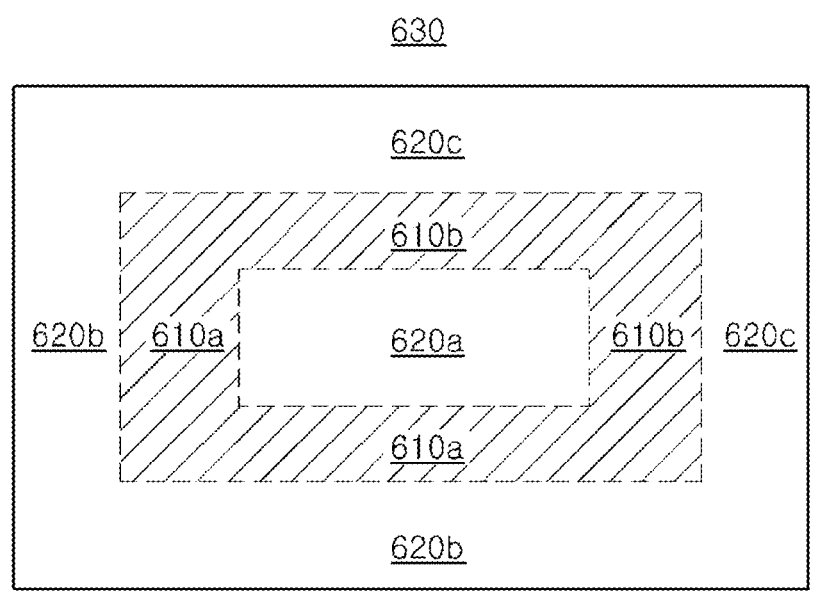
FIG. 12 is a schematic plane view of the cover window according to the third embodiment of the present invention.

Referring to FIG. 12, which is a schematic plane view of the cover window according to the third embodiment of the present invention, the first and second regions 610a and 610b surround the third region 620a at a center of the cover window 630 and are connected to the third region 620a. The fourth and fifth regions 620b and 620c surround the first and second regions 610a and 610b and are connected to the third region first and second regions 610a and 610b. A width (or an area) of the third region 620a is greater than that of each of the first region 610a, the second region 610b, the fourth region 620b and the fifth region 620c.

The first to fifth regions 610a, 610b, 620a, 620b, 620c include the block-copolymer comprising the same high stiffness unit and the same low stiffness unit. In other words, the units, i.e., the high stiffness unit and the low stiffness unit, of the block-copolymer in the first to fifth regions 610a, 610b, 620a, 620b, 620c are same.

However, the mole fraction of the low stiffness unit (or the high stiffness unit) in the block-copolymer in the first and second regions 610 and 620b is different in the third to fifth regions 620a, 620b and 620c. Namely, the mole fraction of the high stiffness unit in the block-copolymer in the third to fifth regions 620a, 620b and 620c is greater than the mole fraction of the high stiffness unit in the block-copolymer in the first and second regions 610a and 610b, and the mole fraction of the low stiffness unit in the block-copolymer in the first and second regions 610a and 610b is greater than the mole fraction of the low stiffness unit in the block-copolymer in the third to fifth regions 620a, 620b and 620c. Accordingly, the first and second regions 610a and 610 has the modulus value being smaller than the third to fifth regions 620a, 620b and 620c.

For example, the block-copolymer for the first and second regions 410, 420a and 420b may be represented by Formula 7.

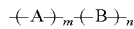 [Formula 7]

In the Formula 7, "A" may be a unit of a polymer selected from a group including polyurethane (PU), polybutylacrylate (PBA), polystyrene, polybutadiene, polyethylene and their copolymer, and "B" may be a unit of a polymer selected from a group including polymethylmethacrylate (PMMA), polycarbonate (PC) and their copolymer. In addition, "m" and "n" is a mole fraction of "A" and "B", respectively, and a summation of "m" and "n" is one (1). (m+n=1)

In the first and second regions 610a and 610b, "m" is greater than "n". In each of the third to fifth regions 620a, 620b and 620c, "m" is smaller than "n".

For example, in the first and second regions 610a and 610b, "m", which is a mole fraction of the low stiffness, may be about 0.6 to 0.95, and "n", which is a mole fraction of the high stiffness, may be about 0.05 to 0.4. In addition, in the third to fifth regions 620a, 620b and 620c, "m" may be about 0.05 to 0.4, and "n" may be about 0.6 to 0.95.

The ratio of the low stiffness unit and the high stiffness unit of the block-copolymer is different between each of the first and second regions 610a and 610b and each of the third to fifth regions 620a, 620b and 620c such that the modulus value of the first to fifth regions 610a, 610b, 620a, 620b and 620c is controlled.

Namely, in the block-copolymer, when the content (i.e., the mole %) of the low stiffness unit is increased, the modulus value of the block-copolymer is decreased. On the other hand, when the content of the high stiffness unit is increased, the modulus value of the block-copolymer is increased. Interface regions between each of the first and second regions 610a and 610b and each of the third to fifth regions 620a, 620b and 620c may have a modulus value between each of the first and second regions 610a and 610b and each of the third to fifth regions 620a, 620b and 420c.

The first and second regions 610a and 610b, where the low stiffness unit in the block-copolymer is relatively high, and the third to fifth regions 620a, 620b and 620c, where the high stiffness unit in the block-copolymer is relatively high, and the interface regions have a difference in a surface morphology.

The flexibility of the first and second regions 610a and 610b are increased such that the first and second regions 610a and 610b have an excellent impact-resistance property. The third to fifth regions 620a, 620b and 620c have excellent hardness and scratch-resistance property and good stiffness.

In other words, the third to fifth regions 620a, 620b and 620c have the stiffness and hardness being greater than the first and second regions 610a and 610b. For example, the stiffness of the third to fifth regions 620a, 620b and 620c is about 2.5 to 7 times greater as the first and second regions 610a and 610b. The hardness (e.g., pensile hardness) of the first and second regions 610a and 610b is 4B to 6B grade, and the hardness of the third to fifth regions 620a, 620b and 620c is more than H grade.

The stiffness and/or the hardness of the interface regions may be gradually changed to be grater from a side of the first second regions 610a and 610b to a side of the third to fifth regions 620a, 620b and 620c.

When the cover window 630, which covers the side surface of the display panel 640 as well as the front surface of the display panel 640, is made of single material (same modulus (stiffness or hardness) in a total), the stress is concentrated at a bending portion in the edges of the display panel 640 such that the cover window 630 is incompletely attached to the display panel 640.

However, in the present invention, since the cover window 630 includes the third region 620a, which corresponds to the display surface of the display panel 640 and has a high modulus value, and the first and second regions 610a and 610b, which correspond to the side surface of the display panel 640 and have a low modulus value, the above problem is not generated.

In addition, since the third region 620a at the display surface of the display panel 640 has a high modulus value, the damage on the display panel 640 by an outer impact is prevented.

On the other hand, when the first and second regions 610a and 610b and the third region 620a of the cover window are formed of different materials to have a difference in the modulus value, the interface regions between each of the first and second regions 610a and 610b and the third region 620b may be observed. Namely, by a refractive index difference in the first to third regions 610a, 610b and 620a, their interface regions may be observed.

However, in the present invention, in the block-copolymer of the first to third regions 610a, 610b and 620a, although there is a difference in the content of the low stiffness unit A (of the Formula 7) and the high stiffness unit B (of the Formula 7), the block-copolymer of the first to third regions 610a, 610b and 620a has the same component, i.e., the low stiffness unit and the high stiffness unit. Accordingly, first to third regions 610a, 610b and 620a and their interface regions have substantially the same refractive index.

Accordingly, the observation of the bending portion of the display panel 640, i.e., the interface region between each of the first and second regions 610a and 610b and the third region 620b is prevented.

On the other hand, by the fourth and fifth regions 620b and 620c, which may formed of the same material as the third region 620a, the rear surface of the display panel 640 is efficiently protected.

Figure 13:
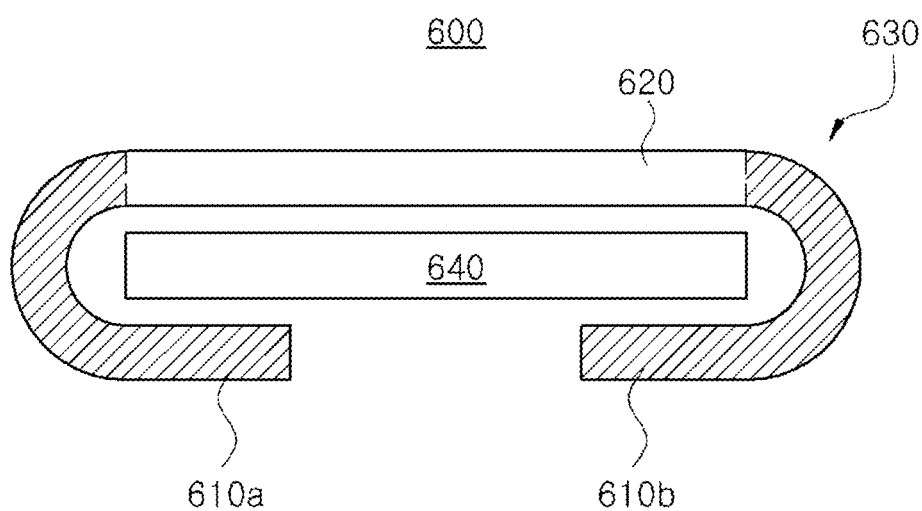
FIG. 13 is a schematic cross-section view of a display device including a cover window according to a fourth embodiment of the present invention.

Alternatively, as shown in FIG. 13, the cover window 630 may include the first to third regions 610a, 610b and 620a without the fourth and fifth regions 620b and 620c (of FIG. 11), and the rear surface of the display panel 640 may be covered with the first and second regions 610a and 610b.

It will be apparent to those skilled in the art that various modifications and variations can be made to the embodiments without departing from the scope of the appended claims. Thus, it is intended that the embodiments are not limiting and modifications and variations are covered provided they come within the scope of the appended claims and their equivalents.

What is claimed is:
1. A cover window, comprising:
a first region; and
second regions at both sides of the first region,
wherein the first region has a stiffness being different from the second regions, and the stiffness of an interface region between the first region and the second region is gradually changed, wherein each of the first and second regions includes a block-copolymer having first and second units, and the first unit has a stiffness being smaller than the second unit, and wherein a mole fraction of the first unit in the first region is different from that of the second unit in the first region, and the mole fraction of the second unit in the second region is different from that of the first unit in the second region.

2. The cover window according to claim 1, wherein a surface morphology in the first region, the second region and the interface region is different.

3. The cover window according to claim 1, wherein the stiffness of the second region is greater than the first region.

4. The cover window according to claim 3, further comprising:
third regions at outer sides of the second regions; and
fourth regions between each second region and each third region,
wherein the stiffness of the third region is greater than the fourth region and is equal to or greater than the second region, and the stiffness of the fourth region is equal to or greater than the first region.

5. The cover window according to claim 1, wherein the hardness of the second region is greater than the first region.

6. The cover window according to claim 5,
further comprising:
third regions at outer sides of the second regions; and
fourth regions between each second region and each third region,
wherein the hardness of the third region is greater than the fourth region and is equal to or greater than the second region, and the hardness of the fourth region is equal to or greater than the first region.

7. The cover window according to claim 1, wherein the stiffness of the first region is greater than the second region.

8. The cover window according to claim 1, wherein the hardness of the first region is greater than the second region.

9. The cover window according to claim 1, wherein the first region, the second region and the interface region have substantially the same refractive index.

10. The cover window according to claim 1, wherein a mole fraction of the first unit in the first region is greater than that of the second unit in the first region, and the mole fraction of the second unit in the second region is greater than that of the first unit in the second region.

11. The cover window according to claim 1, wherein a mole fraction of the second unit in the first region is greater than that of the first unit in the first region, and the mole fraction of the first unit in the second region is greater than that of the second unit in the second region.

12. A cover window, comprising:
a first region; and
second regions at both sides of the first region,
wherein the first region has a stiffness being different from the second regions, and the first region, the second region and an interface region between the first region and the second region have a difference in a surface morphology,
wherein each of the first and second regions includes a block-copolymer having first and second units, and the first unit has a stiffness being smaller than the second unit, and wherein a mole fraction of the first unit in the first region is different from that of the second unit in the first region, and the mole fraction of the second unit in the second region is different from that of the first unit in the second region.

13. The cover window according to claim 12, wherein the first region, the second region and the interface region have substantially the same refractive index.

14. The cover window according to claim 12, wherein a mole fraction of the first unit in the first region is greater than that of the second unit in the first region, and the mole fraction of the second unit in the second region is greater than that of the first unit in the second region.

15. The cover window according to claim 12, wherein a mole fraction of the second unit in the first region is greater than that of the first unit in the first region, and the mole fraction of the first unit in the second region is greater than that of the second unit in the second region.

16. A display device, comprising:
a display panel; and
a cover window at a surface of the display panel and including a first region and second regions at both sides of the first region,
wherein the first region has a stiffness being different from the second regions, and the stiffness of an interface region between the first region and the second region is gradually changed,
wherein each of the first and second regions includes a block-copolymer having first and second units, and the first unit has a stiffness being smaller than the second unit, and
wherein a mole fraction of the first unit in the first region is different from that of the second unit in the first region, and the mole fraction of the second unit in the second region is different from that of the first unit in the second region.

17. The display device according to claim 16, wherein the first region and the second regions correspond to a display surface of the display panel.

18. A di splay device, comprising:
a display panel including a front surface and side surfaces; and
a cover including a plurality of first regions and a second region between the plurality of first regions,
wherein the second region has a stiffness that is greater than the plurality of first regions,
wherein the plurality of first regions respectively cover the side surfaces, and the second region covers the front surface,
wherein each of the first and second regions includes a block-copolymer having first and second units, and the first unit has a stiffness that is smaller than the second unit, and
wherein a mole fraction of the first unit in the first region is different from that of the second unit in the first region, and the mole fraction of the second unit in the second region is different from that of the first unit in the second region.

19. The display device according to claim 18, wherein the plurality of first regions and the second region have substantially the same refractive index.

20. The display device according to claim 18, wherein the cover further includes: a plurality of third regions at an outer side of the plurality of first regions and covering a rear surface of the display panel, and wherein each of the third regions has a stiffness greater than the plurality of first regions.

* * * * *